(12) United States Patent
Kapusta et al.

(10) Patent No.: US 8,514,114 B2
(45) Date of Patent: Aug. 20, 2013

(54) MEASUREMENT METHOD AND APPARATUS FOR ADC CALIBRATION

(75) Inventors: Ronald A. Kapusta, Bedford, MA (US); Junhua Shen, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 8 days.

(21) Appl. No.: 13/312,036

(22) Filed: Dec. 6, 2011

(65) Prior Publication Data

US 2012/0306671 A1    Dec. 6, 2012

Related U.S. Application Data

(60) Provisional application No. 61/492,615, filed on Jun. 2, 2011.

(51) Int. Cl.
*H03M 1/10* (2006.01)
(52) U.S. Cl.
USPC ............................................ 341/120; 341/118
(58) Field of Classification Search
USPC ..................... 341/120, 155, 172, 118, 122
See application file for complete search history.

(56) References Cited

U.S. PATENT DOCUMENTS 7,199,746 B1 *   4/2007   Chowdhury et al. ......... 341/172
7,304,592 B2 *  12/2007   Pinna et al. .................. 341/143

* cited by examiner

*Primary Examiner* — Joseph Lauture
(74) *Attorney, Agent, or Firm* — Kenyon & Kenyon LLP

(57) ABSTRACT

An uncalibrated converter element in an analog-digital converter may be replaced with two or more smaller elements having an effective total net value that is equal to that of the uncalibrated converter element. In an exemplary case where the element is capacitor, one or more of these smaller capacitors may be independently calibrated by switching the smaller capacitor between two voltages, such as a reference voltage and ground, and then calculating a difference of corresponding digital output codes generated by the backend ADC with previously calibrated capacitors associated with lesser significant bits. The total capacitance of the uncalibrated capacitor may be apportioned between the smaller capacitors so that the individual maximum charge contribution of each smaller capacitor to the converter output together with any expected manufacturing variance does not exceed the aggregated contribution of the previously calibrated capacitors.

26 Claims, 10 Drawing Sheets

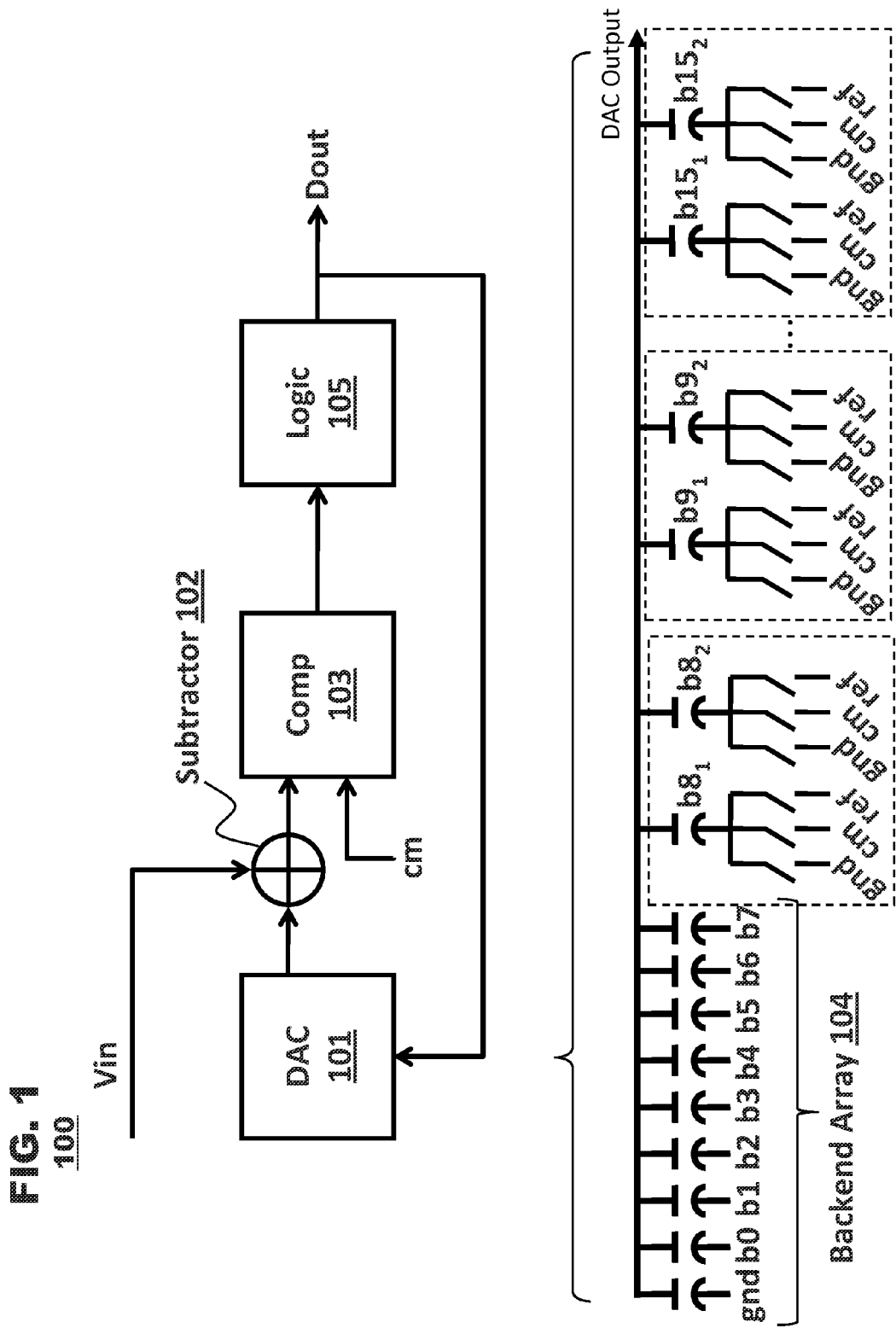

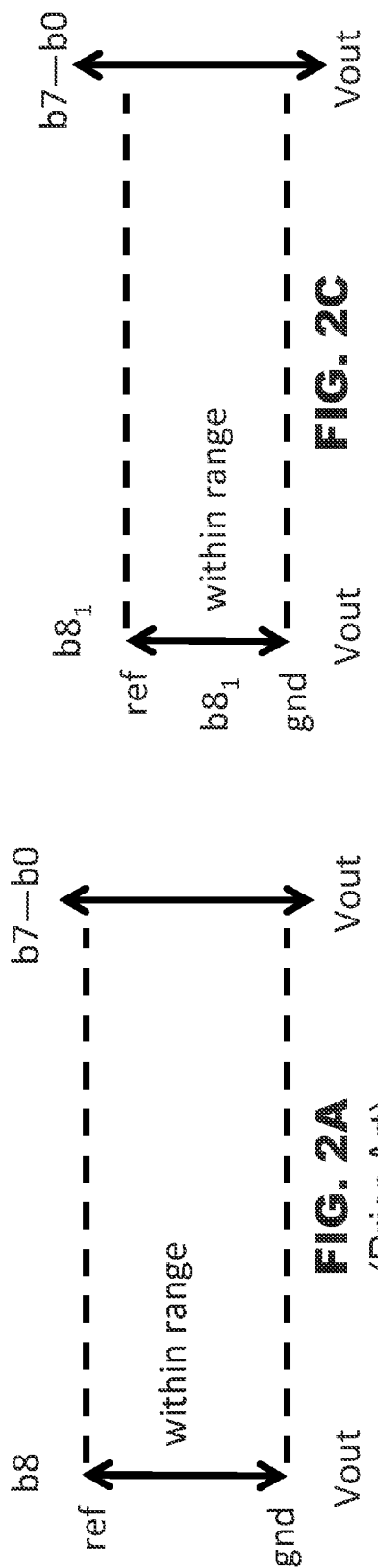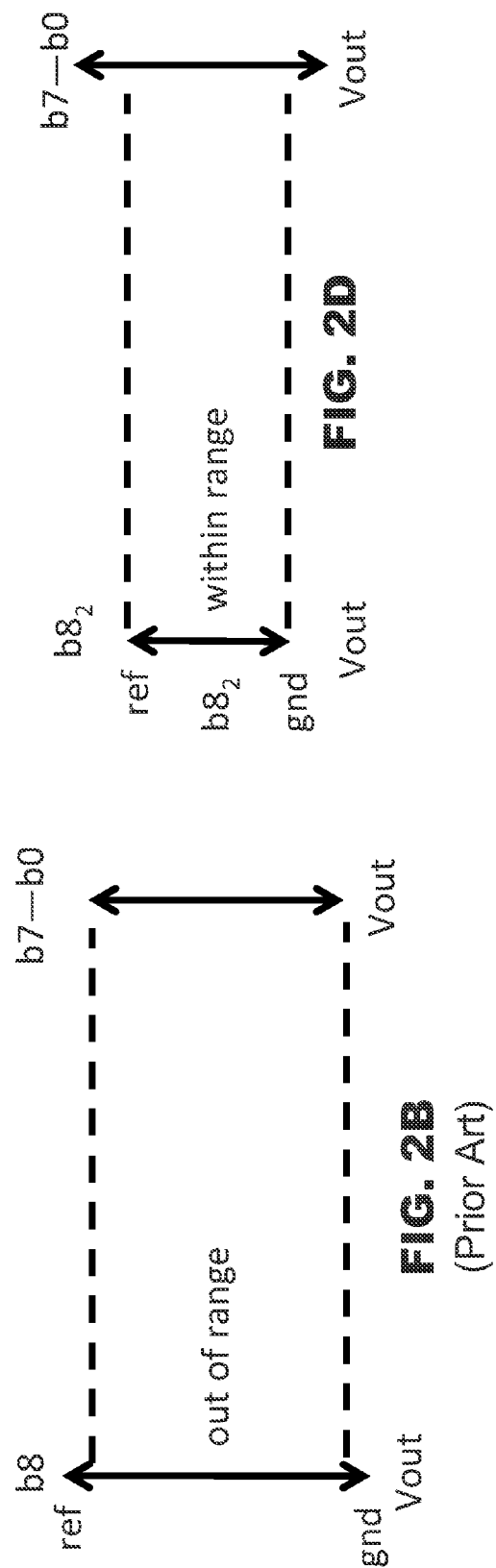
FIG. 2A (Prior Art)
FIG. 2B (Prior Art)
FIG. 2C
FIG. 2D

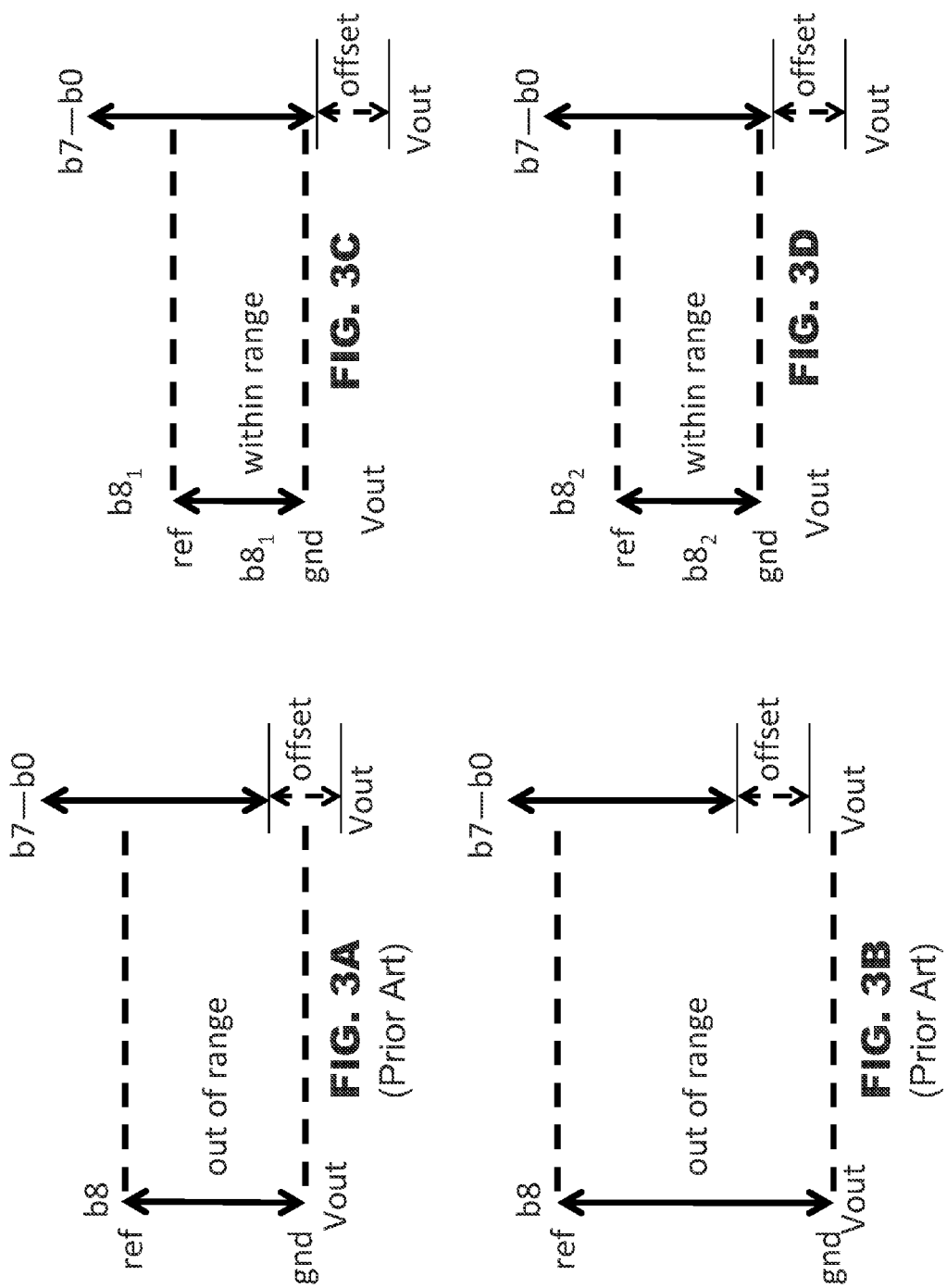

US 8,514,114 B2

MEASUREMENT METHOD AND APPARATUS FOR ADC CALIBRATION

CROSS-REFERENCE TO RELATED APPLICATIONS

This application claims the benefit, under 35 U.S.C. §119 (e), of U.S. Provisional Patent Application No. 61/492,615, filed Jun. 2, 2011, the contents of which is hereby incorporated by reference in its entirety.

BACKGROUND

Successive approximation register (SAR) analog to digital converters (ADCs) convert an analog signal into a digital code representing the signal's voltage. In some instances, these bits may be resolved sequentially from the most significant bit (MSB) to the least significant bit (LSB) using an array of typically binary weighted capacitors. Ordinarily, each bit is represented by a single capacitor, with the capacitor's size weighted to correspond to its respective bit. For a capacitor at an ith bit, the capacitor generally is sized to $2^{i-1} \cdot C_{LSB}$, where $C_{LSB}$ is the size of a capacitor at the least significant bit. To achieve conversion, the analog signal may be coupled initially to each of the capacitors for a predetermined time to allow the signal to be sampled. After this time has elapsed, the capacitors may be decoupled from the analog signal and coupled to a comparator input. Each of the weighted capacitors may then be coupled iteratively to a reference voltage to incrementally adjust the voltage at the comparator input along with capacitors of any bits of previous iterations. This adjusted voltage at the comparator input may then be compared to the reference voltage each time another weighted capacitor is coupled to the reference voltage in order to calculate each bit of the converted digital output signal.

Resolution can be improved by adding additional weighted capacitors to calculate additional bits. However, as the number of weighted capacitors increases, the circuit becomes more sensitive to manufacturing defects and variations that effectively cause static radix deviation. To account for the effects of these defects and variations, an ADC operating at higher resolutions may be calibrated.

Typically, calibration occurs by relying on an initial set of pre-calibrated capacitors or other assumed-ideal converter elements associated with a group of LSBs to calibrate the next converter element or capacitor in the sequence by comparing the effects of each on the converter output. Once a capacitor has been calibrated, the calibrated capacitor may then be used to calibrate the next uncalibrated capacitor in the sequence, and so on. However, this calibration technique will only work if the aggregate maximum voltage generated from charge stored in each of the previously calibrated or assumed-ideal capacitors is greater than or equal to that of the capacitor to be calibrated.

This may not always be the case. For example, manufacturing defects and variances may cause the capacitor to be calibrated to exceed its nominal value and therefore exceed the measureable voltage of the previously calibrated capacitors and reference capacitors. To avoid this, manufacturers often include additional reference capacitors to increase the maximum measureable voltage. While these additional capacitors may be used during calibration, the additional capacitors need not be used during runtime. This leads to an inefficient use of resources during runtime, as power, area, and other resources may be diverted to these additional capacitors even though the capacitors are not needed.

Some of these inefficient configurations include: adding additional redundant capacitors in the ADC, using non-radix-2 bit stages, and using one or more tunable capacitors that may be adjusted to account for any deviations. In other circuit configurations, an additional ADC circuit has been added to assist in capacitor calibration and provide sufficient signal range when measuring capacitor manufacturing deviations. A least-mean-square (LMS) loop has also been used to estimate manufacturing deviations. Each of these configurations may require additional time for signal processing during conversion, may consume additional power, may require additional space to house the added circuitry, and/or may decrease the signal-to-noise ratio.

The inventors perceive a need for more efficient ADC calibration methods and apparatuses that do not result in excess and unused resources.

BRIEF DESCRIPTION OF THE DRAWINGS

FIG. 1 shows an exemplary configuration of capacitors in an embodiment of the invention.

FIGS. 2A and 2B show changes to the DAC output voltage range when toggling prior art capacitors between a reference voltage signal and ground.

FIGS. 2C and 2D show changes to the DAC output voltage range when toggling capacitors in an embodiment of the invention between a reference voltage signal and ground.

FIGS. 3A and 3B show changes to the DAC output voltage range due to an offset when toggling prior art capacitors between a reference voltage signal and ground.

FIGS. 3C and 3D show changes to the DAC output voltage range due to an offset when toggling capacitors in an embodiment of the invention between a reference voltage signal and ground.

DETAILED DESCRIPTION

Figure 4:
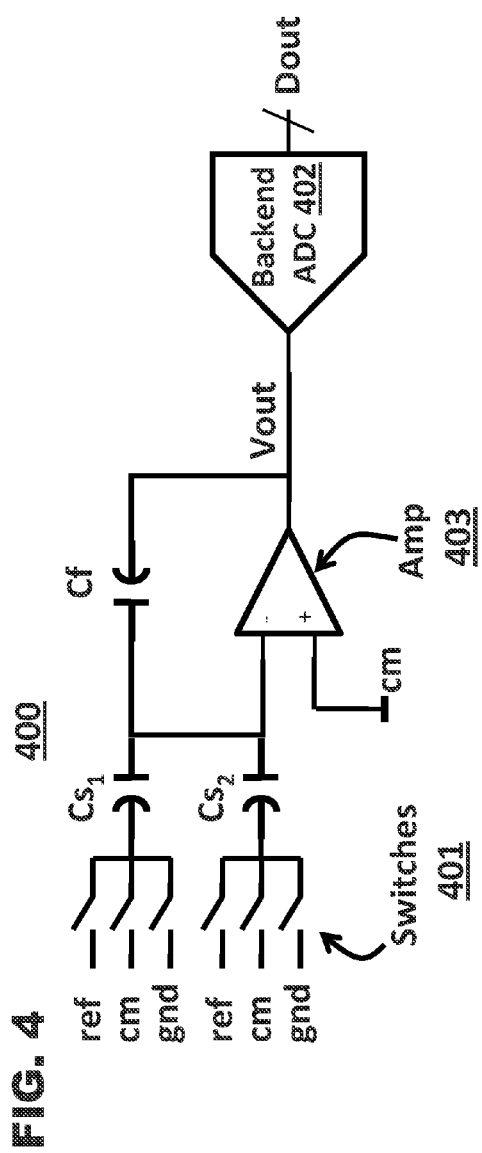
FIG. 4 shows a pipelined ADC circuit configuration in an embodiment of the invention.

In an embodiment, an uncalibrated converter element, such as, for example, a capacitor, resistor, or current source, may be replaced with two or more smaller converter elements functioning equivalently to the uncalibrated converter element when coupled together. For example, an uncalibrated capacitor may be replaced with two or more smaller capacitors having a total capacitance equivalent to that of the uncalibrated capacitor when coupled together.

Each of these smaller converter elements may be calibrated independently by switching the smaller converter elements between a reference voltage and ground and recording the difference of the corresponding digital output codes generated by the ADC with the previously calibrated or assumed-ideal converter elements associated with lesser significant bits. In the case of capacitors, the total capacitance of the uncalibrated capacitor may be apportioned between the smaller capacitors so that the individual maximum charge contribution of each smaller capacitor to the converter output together with any expected manufacturing variance does not exceed the aggregated contribution of the lesser significant bit capacitors previously calibrated or assumed ideal. Other types of converter elements, such as a resistors and current sources, for example, may be similarly apportioned so that the resistance or current at the uncalibrated elements does not exceed the aggregated contribution of the previously calibrated or assumed ideal converter elements.

FIG. 1 shows an exemplary configuration of capacitors in a SAR DAC according to an embodiment of the invention. The DAC 101 may include an array of sixteen binary weighted capacitors coupled to an output of the DAC 101. The capacitors associated with more significant bits (in this case, bits 8 to 15) may be provided as a pair of capacitors, $b8_1$, $b8_2$, $b9_1$, $b9_2$, ... $b15_1$, $b15_2$. Each of these capacitors $b8_1$-$b15_2$ may be coupled via respective switches to a ground potential (gnd), a common mode signal (cm), or a reference potential (ref). At each bit (say bit 8) the two capacitors $b8_1$, $b8_2$ may be sized to half the capacitance of a capacitor that otherwise would be provided at the bit so the combined capacitance is equal to that of the original element. In the case of binary weighted capacitors, capacitors $b8_1$ and $b8_2$ may be sized to b7, the capacitance of bit 7. In a system having binary weighted capacitors per bit (e.g., capacitance of $2^{i-1} \cdot C_{LSB}$), the capacitor pairs to be calibrated may have capacitance of $2^{i-1} \cdot C_{LSB}$ for each capacitor within the pair.

A predetermined number of LSB capacitors (here, capacitors b0 to b7) may be provided as a single capacitor per bit and may be binary weighted. Each of these capacitors may be pre-calibrated or otherwise assumed to be correct.

The ADC 100 may include the DAC 101, an subtractor 102, a comparator 103 and a logic circuit 105. The subtractor 102 may generate an output signal representing a difference between the input voltage Vin and the output of the DAC 101. The subtractor's output may be input to the comparator 103 that compares the DAC output to a common mode voltage. The results of the comparison may then be stored in the logic 105. During runtime, the ADC 100 may operate iteratively to test each bit of a digital code. Starting with the most significant bit (MSB), the ADC 100 may connect the MSB capacitors (capacitors $b15_1$, $b15_2$) to the reference potential. The comparator 103 may generate a binary signal representing a comparison between the subtractor's output and the common mode voltage. During a next iteration, switches of the MSB may be set according to the results of the comparator's output and the switches of the second MSB $b14_1$, $b14_2$ (not shown) would be set to the reference potential. During this runtime operation, switches for the capacitor pairs of each bit $b8_1$, $b8_2$, $b9_1$, $b9_2$, ... $b15_1$, $15_2$ may be switched in unison.

During calibration, the capacitors of each bit $b8_1$, $b8_2$, $b9_1$, $b9_2$, ... $b15_1$, $b15_2$ may be switched independently to calibrate each capacitor. To ensure accurate runtime bit determinations, each of the uncalibrated capacitors $b8_1$ to $b15_2$ may be calibrated as discussed in the following paragraphs:

A first capacitor at a least significant bit of the uncalibrated capacitors (in this case, for example, $b8_1$) may be calibrated by connecting the first capacitor to a reference voltage while avoiding any charge contribution from any remaining capacitors at the same or higher bits ($b8_2$ to $b15_2$) by, for example, open circuiting those capacitors ($b8_2$ to $b15_2$) or shorting them to common mode. The capacitors at the lower significant bits (in this case b0 to b7) may be used as a backend ADC capacitor array 104 forming a negative feedback loop to offset the charge stored on capacitor $b8_1$ and generating a corresponding first output code. The first capacitor ($b8_1$) may then be switched to a ground potential causing the capacitors at the lower significant bits (b0 to b7) to generate a corresponding second output code. Logic 105 may be used to compare the first and second output codes to identify an actual capacitance of the first capacitor ($b8_1$), which may be used to calibrate the first capacitor.

The process may then be repeated for the second uncalibrated capacitor (in this case $b8_2$) while the first capacitor $b8_1$ and those at higher bits b9 to b15 are open circuited or shorted to common mode. Once both of these capacitors $b8_1$ and $b8_2$ have been calibrated, the process may then move to the capacitors associated with a next higher bit (in this case $b9_1$ and $b9_2$). In doing so, the previously calibrated first and second capacitors ($b8_1$ and $b8_2$) may be included as part of the backend ADC capacitor array 104 forming a negative feedback loop to offset the charge stored on capacitors $b9_1$ and/or $b9_2$. The process may then repeat until each of the capacitors at the high bits has been calibrated.

The logic 105 may determine which, if any, of the three signals (ground, common mode, and reference) each capacitor may be coupled to at any given instance. For example, to calibrate capacitor $b8_1$ the logic may be configured to first ensure that capacitors representing $b8_2$ and any higher order bits such as $b9_1$ to $b15_2$ do not affect the charge distribution at the DAC output, by for example, toggling the capacitors to an open circuit configuration.

Then the logic 105 may couple the uncalibrated capacitor $b8_1$ to a reference signal to generate a first ADC output code represented by capacitors b7-b0. The uncalibrated capacitor $b8_1$ may later be decoupled from the reference signal and coupled to a ground or second voltage signal to generate a second ADC output code represented by capacitors b7-b0. A difference between the first and second ADC output codes may be measured to calculate a capacitance of $b8_1$.

Similar procedures may be used to calibrate each of the other capacitors. The newly calibrated capacitors may join the pool of previously calibrated or assumed-ideal capacitors and be used when calibrating capacitors having a higher capacitance associated with a next more significant bit.

FIGS. 2A to 2B show changes to the DAC output voltage (Vout) that may occur in the prior art when toggling a single uncalibrated capacitor (in this case b8) between a reference (ref) voltage signal and ground (gnd) in an embodiment. FIG. 2A shows the effect on Vout from a manufacturing variance resulting in a weight of capacitor b8 that is less than its nominal value. In this case, the difference in DAC output voltage is within the range of the reference capacitors b7-b0, so an effect of a change in voltage by toggling b8 between the reference signal and ground can be measured using the capacitors b7-b0. In FIG. 2B, however, where the manufacturing variance results in weight of capacitor b8 that is greater than its nominal value, the voltage values may be outside the range of the calibrated capacitors and the calculation may be off by an amount that is not measureable using capacitors b7 to b0.

FIGS. 2C and 2D show the effect on Vout of splitting capacitor b8 into two separate capacitors $b8_1$ and $b8_2$ having an effective capacitance equal to that of b8. In these two figures, changes to the DAC output voltage (Vout) when toggling each of the two separate capacitors independently between a reference voltage signal and ground are much less than that of the single capacitor b8, since the overall capacitance is split between two capacitors instead of one. Thus, changes to the DAC output voltage when independently toggling each of these two capacitors between a reference voltage and a ground voltage may be within the measurable range using calibrated capacitors b7 to b0, even after accounting for any manufacturing variances in each of the two capacitors.

FIGS. 3A to 3B show the effect on Vout in the prior art due to an offset when toggling a single uncalibrated capacitor (in this case b8) between a reference (ref) voltage signal and ground (gnd). The offset may be caused, for example, by variations in the actual transfer function of the converter from an ideal transfer function. In these situations, the offset may cause calibration errors to occur more frequently and to a greater extent in situations where the uncalibrated capacitor has a weight that is less than (FIG. 3A) or greater than (FIG. 3B) its nominal value.

FIGS. 3C and 3D show the effect on Vout due a similar offset as in FIGS. 3A and 3B after splitting the uncalibrated capacitor b8 into two separate capacitors $b8_1$ and $b8_2$ having a total effective capacitance equal to that of b8. In both of these two cases, changes to the DAC output voltage when independently toggling each of these two capacitors between a reference voltage and a ground voltage may be within the measurable range of calibrated capacitors b7 to b0, even after accounting for any offset effect as well as any manufacturing variances in each of the two capacitors. In the case where the offset is too big to be tolerated, we may use the otherwise open circuited capacitors and connect them to reference or ground to roughly compensate for the offset. With the split capacitors, the offset compensation will be more accurate.

FIG. 4 shows another circuit configuration—that of a pipelined ADC 400—that may be implemented in an embodiment of the invention. In this embodiment, an uncalibrated capacitor Cs in a pipelined ADC stage may be split into two separate capacitors $Cs_1$ and $Cs_2$ as shown in the figure. A switching arrangement may be coupled to each of these capacitors $Cs_1$ and $Cs_2$ to enable the capacitors to be individually switched between different potentials, such as reference potential, common mode potential, or ground potential. Each of the two capacitors $Cs_1$ and $Cs_2$ may also be coupled to a third capacitor Cf. The capacitors $Cs_1$ and $Cs_2$ may also be coupled to a first input of the pipelined ADC stage. The second input of the stage may be coupled to a common mode signal. The output of the amplifier 403 may be coupled to the capacitor Cf and to an input of the backend ADC 402, which may generate a digital output code. The two capacitors $Cs_1$ and $Cs_2$ may have a combined effective capacitance in the circuit equal to that of Cs.

Any manufacturing variances or mismatches in either $Cs_1$ or $Cs_2$ may be measured by separately switching one of these capacitors between a ground and a reference signal, using, for example, switching arrangement 401. A difference between the output signals (Dout) generated from a backend ADC 402 in these two modes can then be used to calculate the ratio between each capacitor and Cf, such as Cs1/Cf and Cs2/Cf.

Figure 5:
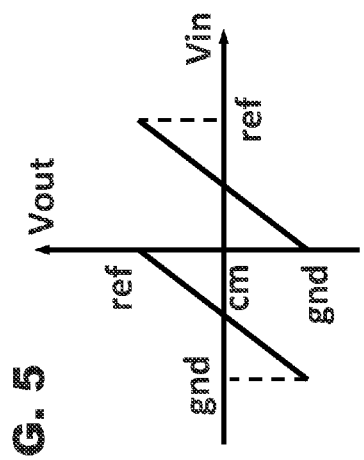
FIG. 5 shows the residual transfer function of the circuit shown in FIG. 4 having no redundancy.

FIG. 5 shows the residual transfer function of the circuit shown in FIG. 4 having no redundancy. The transfer function equation is:

$$Vout = \frac{(cs_1 + cs_2) \cdot Vin}{cf} \pm \left(\frac{cs_1 + cs_2}{cf} \cdot \frac{Vref}{2}\right)$$

From this equation, as the reference signal voltage (Vref) is switched between the reference voltage and ground, the net change in the output voltage will be $(Cs_1+Cs_2)\cdot Vref/Cf$. If $Cs_1$ and $Cs_2$ are controlled so that $Cs_1$ does not affect the output voltage as $Cs_2$ is switched between the reference voltage and ground, such as $Cs_1$ being open circuited, and vice versa, then $Cs_1/Cf$ and $Cs_2/Cf$ can each be measured and calibrated accordingly.

If $Cs_1$ and $Cs_2$ were combined into a single Cs capacitor and any manufacturing variances or mismatches resulted in the capacitance of Cs to exceed that of Cf, the voltage changes caused by switching Cs may exceed range provided by the backend ADC and Cs/Cf may not be accurately measured or calibrated. Splitting Cs into two separate capacitors $Cs_1$ and $Cs_2$ and measuring them separately may ensure that there are sufficient margins between each of the values of $Cs_1$ and $Cs_2$ and Cf to accurately measure and calibrate the capacitor ratio Cs/Cf.

Figure 6:
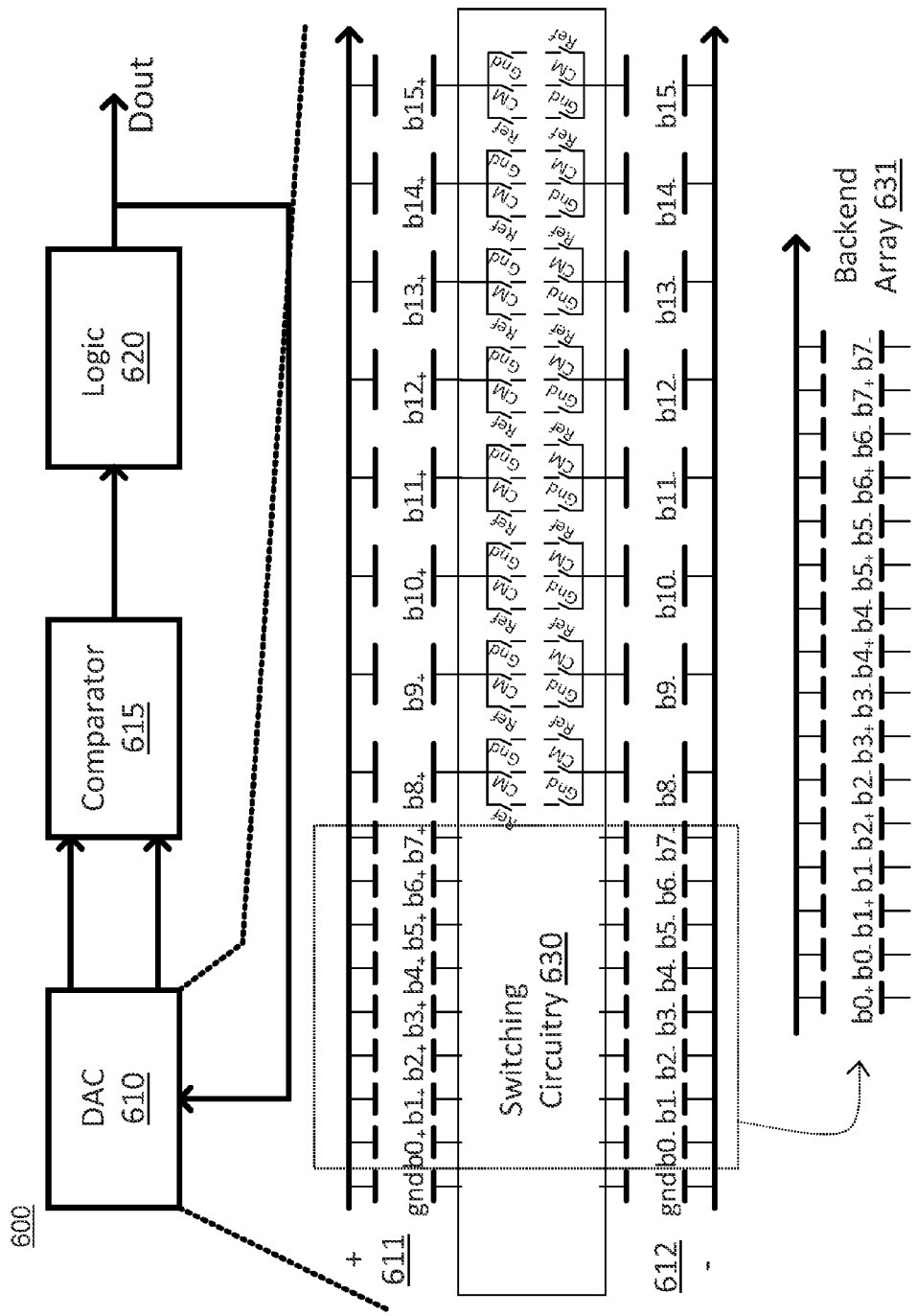
FIG. 6 shows an exemplary embodiment of the invention in a differential SAR DAC.

FIG. 6 shows an exemplary embodiment of the invention in a differential SAR ADC 600. The differential SAR ADC 600 may include a DAC 610, comparator 615, and logic 620. The DAC 610 may include two arrays of sixteen binary weighted capacitors, though in other embodiments different radices and numbers of capacitors may be used. Each of the capacitor arrays may be associated with a respective one of the two complementary differential signal pairs.

A plurality of more significant bits in each of the two capacitor arrays (bits 8 to 15 in the example of FIG. 6) may be coupled independently via switching circuitry 630 to a ground potential (gnd), a common mode signal (cm), or a reference potential (ref). In a system having binary weighted capacitors per bit, the capacitor pairs of the more significant bits may have capacitance of $2^{i-1}\cdot C_{LSB}$ for each capacitor within the pair, where i represents the bit.

A predetermined number of LSB capacitors (here, capacitors b0 to b7) in each of the two arrays may be provided as a single capacitor per bit and may be binary weighted. Each of these capacitors may be pre-calibrated or otherwise assumed to be correct.

The comparator 615 may compare the DAC output from each of the capacitor arrays associated with a respective differential signal to a corresponding input voltage. The results of the comparison may then be stored in the logic 105.

During runtime, the ADC 600 may operate iteratively to test each bit of a digital code. Starting with the most significant bit (MSB), the ADC 600 may connect the MSB capacitors in each capacitor array (capacitors b15) to the reference potential. The comparator 615 may generate a binary signal representing a comparison between the DAC output and an input voltage. During a next iteration, switches of the MSB may be set according to the results of the comparator's output and the switches of the second MSB b14 would be set to the reference potential. During this runtime operation, switches for the capacitor pairs of each bit b8 to b15 may be switched in unison.

During calibration, the capacitors of each bit b8 to b15 in each of the two complementary signal pair arrays 611 and 612 may be switched independently to calibrate each capacitor. To ensure accurate runtime bit determinations, each of the uncalibrated capacitors b8 to b15 associated with each complementary signal pair array 611 and 612 may be calibrated as discussed in the following paragraphs:

A first capacitor at a least significant bit of the uncalibrated capacitors in one of the complementary signal pairs (in this case, for example, $b8_+$ in the positive signal line array 611) may be calibrated by connecting the first capacitor to a reference voltage while avoiding any charge contribution from any remaining capacitors at the same or higher bits ($b8_-$ in the negative signal line array 612 and capacitors b9 to b15 in both arrays 611 and 612) by, for example, open circuiting those capacitors. The capacitors at the lower significant bits in both signal line arrays (in this case b0 to b7 in arrays 611 and 612)

may be collectively coupled together to form a single backend ADC capacitor array 631 creating a negative feedback loop to offset the charge stored on capacitor $b8_+$. In doing so, these capacitors (b0 to b7 in both arrays 611 and 612) may generate a corresponding first output code.

The first capacitor ($b8_+$) may then be switched to a ground potential causing the coupled capacitors at the lower significant bits (b0 to b7 in both arrays 611 and 612) to generate a corresponding second output code. The first and second output codes may be compared to identify an actual capacitance of the first capacitor ($b8_+$), which may be used to calibrate the first capacitor.

The process may then be repeated for the second uncalibrated capacitor (in this case $b8_-$) while the first capacitor $b8_+$ and those at higher bits b9 to b15 in both arrays 611 and 612 are open circuited. Once both of these capacitors $b8_+$ and $b8_-$ have been calibrated, the process may then move to the capacitors associated with a next higher bit (in this case $b9_+$ and $b9_-$). In doing so, the previously calibrated first and second capacitors ($b8_+$ and $b8_-$) may be included as part of the backend ADC capacitor array 631 forming a negative feedback loop to offset the charge stored on capacitors $b9_+$ and/or $b9_-$. The process may then repeat until each of the capacitors at the high bits has been calibrated.

The logic 620 may determine which, if any, of the three signals (ground, common mode, and reference) each capacitor may be coupled to at any given instance. For example, to calibrate capacitor $b8_+$ the logic may first ensure that capacitors representing $b8_-$ and any significant bits such as b9 to b15 in both arrays 611 and 612 do not affect the charge distribution at the DAC output, by for example, toggling the capacitors to an open circuit configuration. The logic may also use switching circuitry 630 to form the backend array 631 coupling capacitors b0 to b7 from both arrays 611 and 612 together.

The logic 620 may also couple the uncalibrated capacitor $b8_+$ to a reference signal to generate a first ADC output code represented by a voltage change at calibrated capacitors b7-b0 from both arrays 611 and 612 that were coupled together to form the backend array 631. The uncalibrated capacitor $b8_+$ may later be decoupled from the reference signal and coupled to a ground or second voltage signal to generate a second ADC output code represented by a corresponding voltage change at calibrated capacitors b7-b0 from both arrays 611 and 612 forming the backend array 631. A difference between the first and second ADC output codes may be measured to calculate a capacitance of $b8_+$. A result may then be stored in logic 620.

Similar procedures may be used to calibrate each of the other capacitors. The newly calibrated capacitors may join the pool of previously calibrated or assumed-ideal capacitors and be used when calibrating capacitors having a higher capacitance associated with a next more significant bit.

Figure 7:
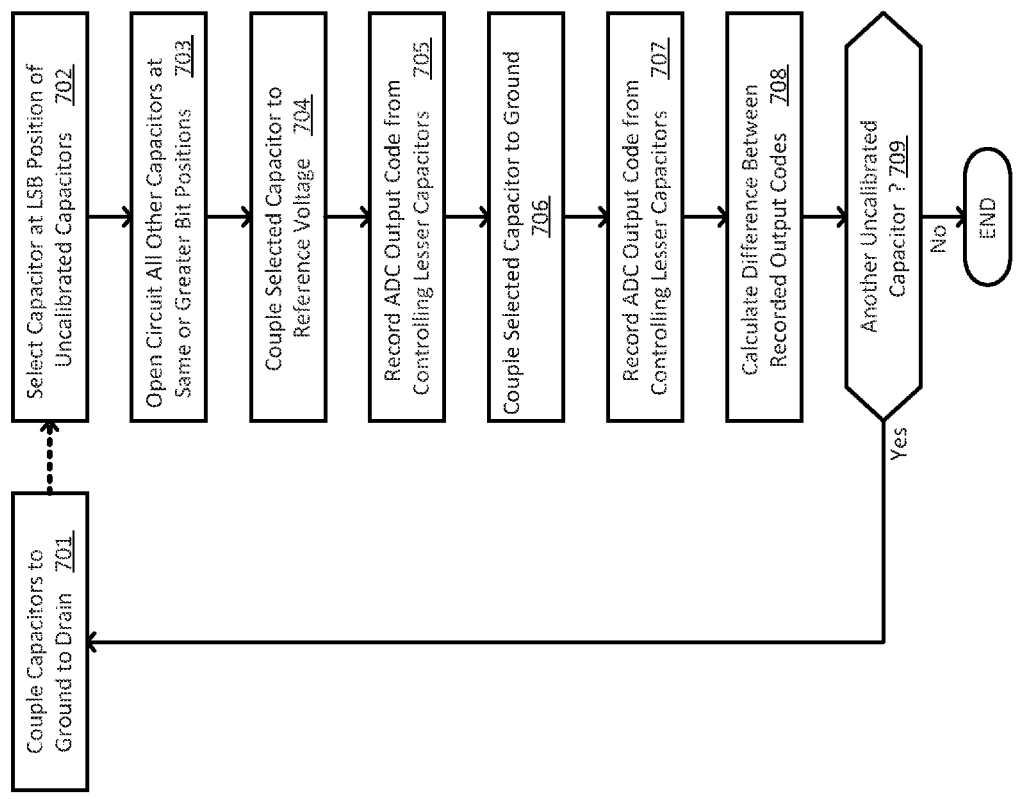
FIG. 7 shows an exemplary process in an embodiment for switching the capacitor couplings shown in FIG. 6.

FIG. 7 shows an exemplary process in an embodiment for switching the capacitor couplings shown in FIG. 6. In box 701, the circuit may be reset by coupling each of the capacitors through the switching circuitry to a ground to drain each of the capacitors.

In box 702, a single capacitor at a least significant bit of the uncalibrated capacitors may be selected. The selected capacitor can be from either signal line in the differential signal pair.

In box 703, each of the other capacitors at the same or at more significant bits than the selected capacitor may be open circuited or otherwise switched to a state where the capacitors do not contribute charge or otherwise affect the output voltage as a result of switching the other capacitor couplings.

In box 704, the selected capacitor may be coupled to a reference voltage through the switching circuitry.

In box 705, the first digital output code generated by the SAR ADC controlling each of the other capacitors coupled to both signal lines at lesser significant bits than the selected capacitor may be recorded.

In box 706, the selected capacitor may be coupled to ground through the switching circuitry.

In box 707, the second digital output code generated by the SAR ADC controlling each of the other capacitors coupled to both signal lines at lesser significant bits than the selected capacitor may be recorded.

In box 708, the weight of the capacitor being measured may be obtained by calculating the difference of the first and second digital output codes.

In box 709, a check may be performed to determine whether additional capacitors may need to be calibrated. If no more capacitors need calibrating, the process may end. Otherwise, in box 701, the capacitors may be coupled to ground through the switching circuitry to drain the capacitors, if necessary. In box 702, a next capacitor to be calibrated may be selected, and so on.

Figure 8:
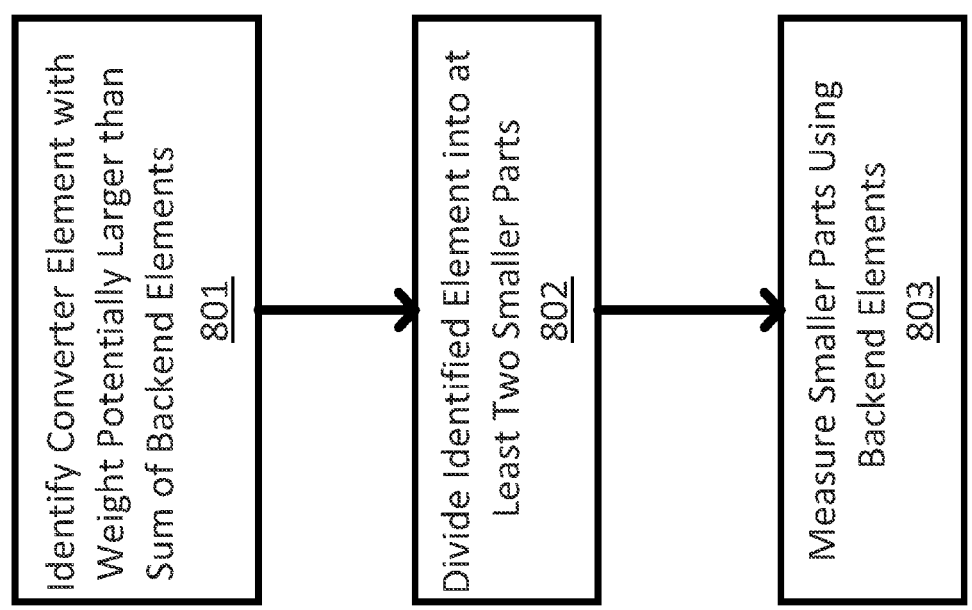
FIG. 8 shows an exemplary process in an embodiment.

FIG. 8 shows an exemplary process in an embodiment. In box 801, one or more uncalibrated converter elements, such as an uncalibrated capacitor, may be examined to determine whether the converter element represents a weight (or in the case of a capacitor, a capacitance) potentially greater than or equal to the sum of those of the reference backend elements, due to non-ideal manufacturing process or other factors. In some instances, the examination may occur in a predetermined order. For example, in a SAR DAC, the converter elements may be examined in order starting with those representing a lowest weight or least significant bit to the next lowest weight or least significant bit, and so on.

In box 802, an identified converter element that represents a weight greater than or equal to the sum of the backend elements may be split into two or more smaller elements, each of which represents a weight less than the sum of the backend elements. In some instances, the identified converter element may be split into smaller elements of equal weight though in other embodiments the weights may be allocated differently amongst the smaller elements.

In box 803, each smaller part may be individually measured by switching a selected smaller part between a reference voltage and ground while preventing any more significant elements and non-selected smaller parts from affecting the converter output. Since the backend elements should have a combined weight exceeding that of each smaller part, switching a single selected smaller part between the reference voltage and ground can be measured by the SAR ADC with the backend elements. Thus, the change in ADC digital output codes from switching the selected smaller part from a reference voltage to ground may be recorded and used to calculate the weight of the selected smaller part.

The weights of the other smaller parts may be similarly calculated by repeating the process with each of the other smaller parts. The size of each smaller part may also be selected to avoid any need to extend the input range of backend ADC. In some instances, splitting converter elements into smaller parts may eliminate the need for built-in redundancy features in ADCs where bits are resolved sequentially from the most to least significant bits, such as pipeline or SAR ADCs.

For example, in a SAR ADC with a capacitive DAC array, each capacitor may be split into smaller parts and measured using an existing backend ADC, thereby eliminating the need for redundancy features, such as redundant capacitors, or relying on a non-radix-2 capacitor array. In a binary weighted capacitive DAC array where the nominal value of each capacitor to be measured is equal to the sum of those capacitors representing less significant bits, each capacitor to be measured may be split into smaller parts measurable using a backend ADC In some embodiments, only one of the equally sized smaller parts may be measured in some embodiments. The measured value may be automatically assigned to the remaining equally sized smaller parts.

Half the weight of a converter element may be measured by switching the element between a common mode signal and a −Vref/Vref signal without necessarily splitting the signal into two components. In a differential circuit, half the weight may be measured by switching only one of the signal pairs between −Vref and Vref while keeping the other side constant.

In a pipelined ADC that does not include any stage redundancy features, a converter element may be divided into smaller parts to ensure that the output of the stage is less than the input range of a backend ADC.

Figure 9:
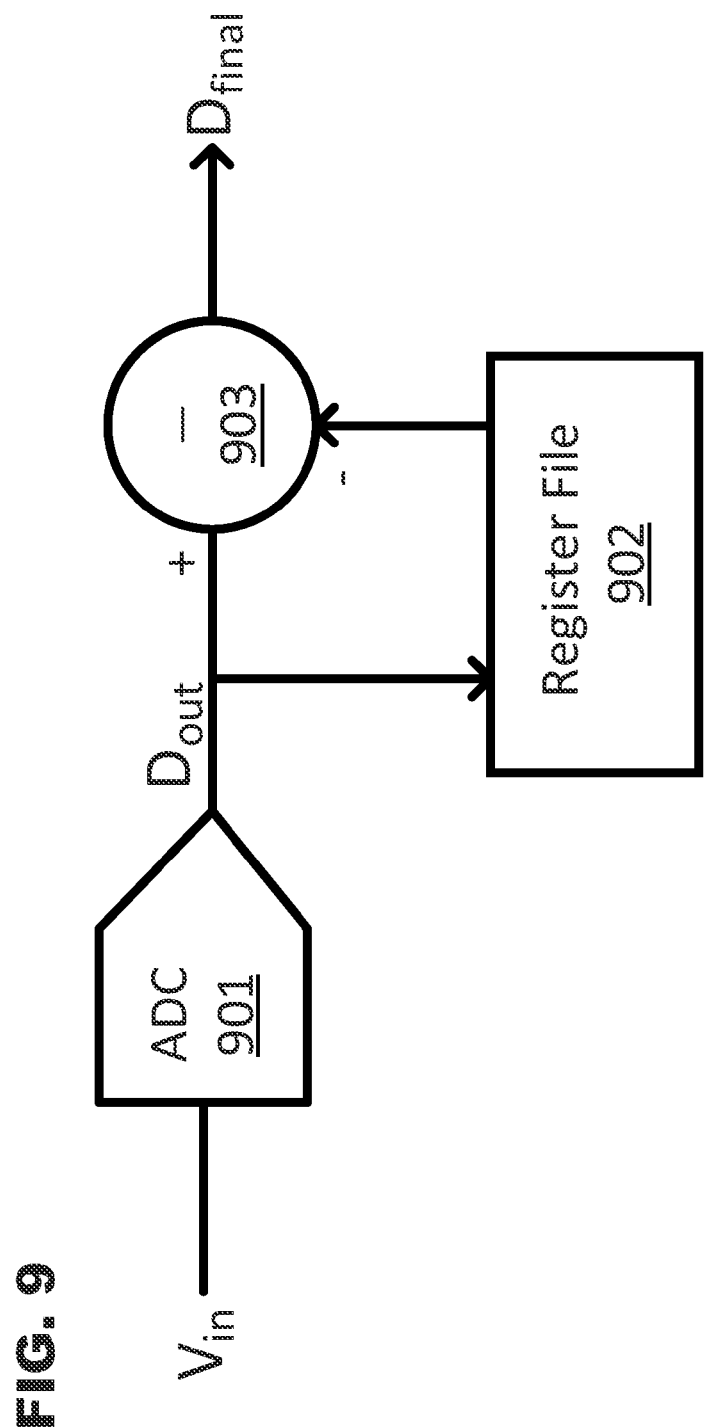
FIG. 9 shows an exemplary circuit in an embodiment.

FIG. 9 shows an exemplary circuit for incorporating the calibration results at runtime after circuit manufacturing. The results of the capacitor calibrations may be stored in logic 902. During runtime, the ADC 901 may output a digital signal Dout. The calibration factors for each bit due to capacitor variances and mismatches may be retrieved from the logic 902 and subtracted from Dout through a subtractor circuit 903 to generate Dfinal.

Figure 10:
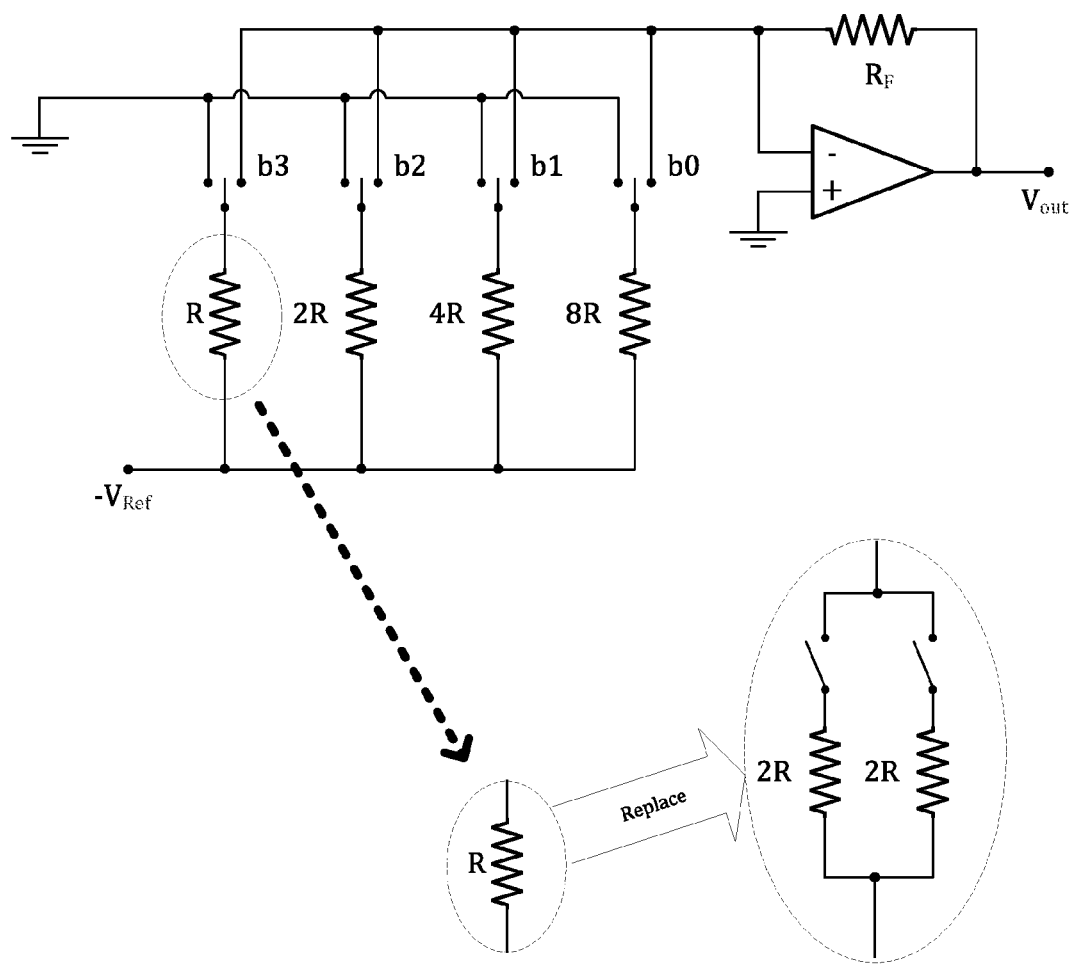
FIG. 10 shows an exemplary binary-weighted resistor DAC in an embodiment of the invention.
Figure 11:
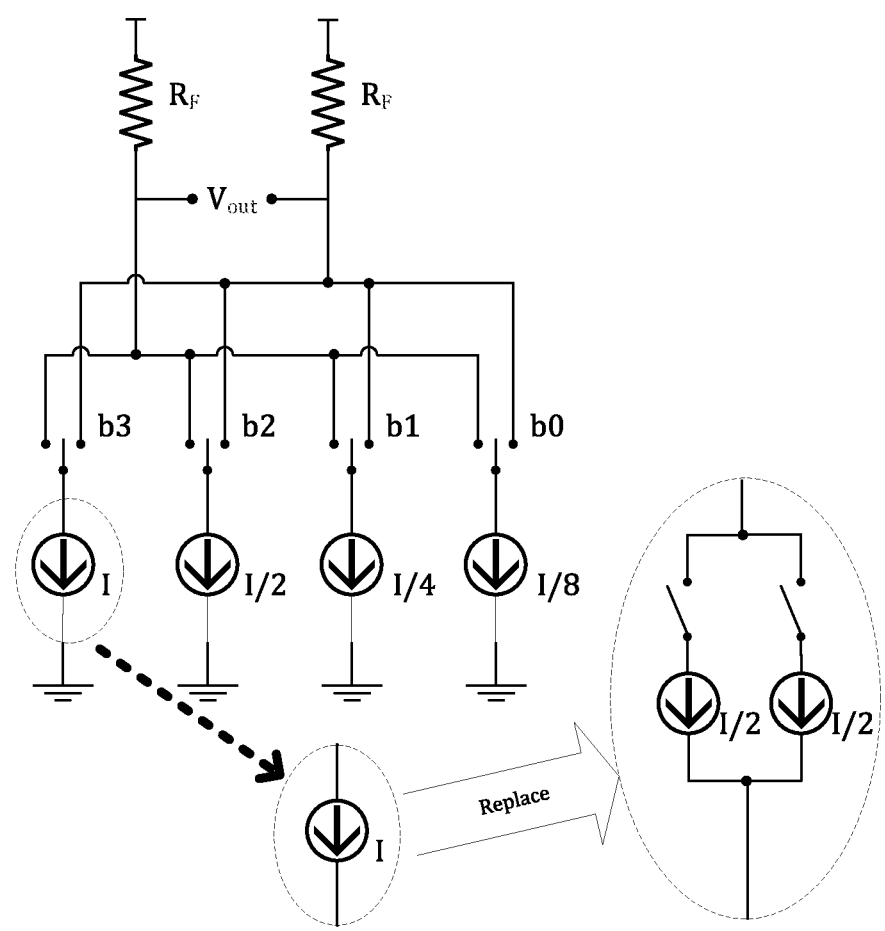
FIG. 11 shows an exemplary current steering DAC in an embodiment of the invention.

FIGS. 10 and 11 show alternative embodiments in which converter elements other than capacitors, such resistors and current sources, are split into two or more smaller elements to facilitate calibration of these converter elements. FIG. 10 shows an exemplary four bit binary weighted resistor DAC. In FIG. 10, a resistor having resistance R may be replaced with two separate resistors coupled in parallel, each having a resistance 2R. These resistors may then be toggled individually to measure their effective resistances as discussed previously. In another embodiment, a second reference voltage $-V_{Ref}/2$ may be generated instead of replacing the resistor having resistance R to achieve the same goal.

FIG. 11 shows an exemplary four bit current steering DAC. In FIG. 11, a current source generating current I may be replaced with two current sources coupled in parallel, each generating a current I/2. These current sources may then also be toggled individually in a similar manner discussed in the previous examples to apply the split converter element concept and calibrate each of these current sources.

The foregoing description has been presented for purposes of illustration and description. It is not exhaustive and does not limit embodiments of the invention to the precise forms disclosed. Modifications and variations are possible in light of the above teachings or may be acquired from the practicing embodiments consistent with the invention. For example, some of the described embodiments refer to 16 bit ADCs and/or 4 bit DACs, but in other embodiments, the converters may have different resolutions and have different configurations. Additionally, some embodiments refer to binary weighted DACs, such as binary weighted capacitor DACs, binary weighted resistor DACs, and binary weighted current steering DACs, but other embodiments may include non-binary weighted converter elements, and need not include binary weighted converter elements. Finally, some embodiments describe the use of a capacitors as converter elements, but as shown in FIGS. 10 and 11, converter elements need not be limited to capacitors, and may include other converter element types, such as resistors and current sources.

We claim:

1. An analog-to-digital converter (ADC) for converting an input signal to a multi-bit digital code, comprising:
   a converter element array comprising:
      for a first range of least significant bits of the digital code, a plurality of converter elements, at least one converter element provided for each bit in the first range,
      for a second range of most significant bits of the digital code, a plurality of converter elements provided for each bit in the second range, and
      a switch control of the converter element array individually switching each of the converter elements in the second range at least once between two reference potentials; and
   a comparator coupled to the converter element array capable of generating digital output codes from output signals at converter elements in the first range corresponding to each of the two reference potentials individually applied to the converter elements in the second range,
   wherein the switch control individually switches each of the converter elements between the two reference potentials to individually calibrate each of the converter elements and
   wherein each respective generated digital output code is a calibration value for a respective converter element in the second range that is subsequently used to correct an output of the respective converter element.

2. The ADC of claim 1, wherein, the switch control is capable of individually switching each of the converter elements in the second range during a first mode of operation and is capable of switching in unison those converter elements provided for a respective bit in the second range during a second mode of operation.

3. The ADC of claim 1, wherein the converter elements are capacitors and the converter element array is a capacitive digital-to-analog (DAC) array.

4. The ADC of claim 3, wherein the capacitive DAC array is binary weighted, a pair of capacitors are provided for each bit in the second range, a single capacitor is provided for each bit in the first range, and each capacitor provided for a lowest bit in the second range has a capacitance generally equal to that of the single capacitor provided for a highest bit in the first range.

5. The ADC of claim 1, further comprising a logic circuit coupled to the comparator, wherein the ADC operates in a calibration mode in which:
   the logic circuit calculates a difference between the digital output codes corresponding to each of the two reference potentials to calibrate the converter element being individually switched by the switch control.

6. An analog-to-digital converter (ADC) comprising:
   a plurality of capacitors provided for a first bit in the ADC;
   at least one capacitor provided for each lesser significant bit in the ADC than the first bit and coupled to the plurality of first bit capacitors; and
   a switching arrangement individually switching each of the first bit capacitors at least once between a plurality of potentials,
   wherein a capacitance of each first bit capacitor is less than a total capacitance of the lesser significant bit capacitor (s),
   wherein the switching arrangement individually switches each of the first bit capacitors between the potentials to generate a calibration value for each respective first bit capacitor that is subsequently used to correct an output of the ADC.

7. The ADC of claim 6, wherein the switching arrangement is configured to individually switch each of the first bit capacitors between the plurality of potentials during a first mode of operation and is configured to switch the plurality of first bit capacitors in unison during a second mode of operation.

8. The ADC of claim 6, wherein the plurality of potentials include a ground potential and a reference potential.

9. The ADC of claim 6, further comprising a digital code generating arrangement to generate a digital code from a voltage change at the lesser significant bit capacitor(s) responsive to the switching arrangement switching one of the first bit capacitors between the potentials.

10. The ADC of claim 6, further comprising a circuitry arrangement to prevent a first bit capacitor that was not switched between potentials from affecting the voltage change at the lesser significant capacitor(s).

11. An analog-to-digital converter (ADC) comprising:
a plurality of converter elements provided for a plurality of less significant bits in the ADC;
a plurality of converter elements provided for each more significant bit in the ADC, the more significant bit converter elements coupled to the less significant bit converter elements;
a switchably enabled selector individually toggling each of the more significant bit converter elements at least once between a reference signal and a ground and decoupling those non-toggled converter elements at a same or more significant bit than the converter element being individually toggled;
a comparator to generate digital output codes from a change in electric charge at the less significant converter elements responsive to the toggling; and
a logic circuit to store and compare the generated digital output codes,
wherein the switchably enabled selector individually toggles each of the more significant bit converter elements between the reference signal and the ground to individually calibrate each of the more significant bit converter elements and
wherein the generated digital output codes are calibration values for respective more significant bit converter elements that are subsequently used to correct an output of the respective converter elements.

12. The ADC of claim 11, wherein, the switchably enabled selector is capable of individually toggling each of the more significant bit converter elements between the reference signal and the ground during a first mode of operation and is capable of switching in unison those converter elements provided for a respective more significant bit during a second mode of operation.

13. A method for calibrating a converter element in an analog-to-digital converter (ADC) comprising:
at a more significant bit in the ADC:
switching a first of a plurality of converter elements provided for the more significant bit to a first reference potential;
identifying a first voltage change at an output of converter elements provided for less significant bits in the ADC coupled to the first converter element;
switching the first converter element to a second reference potential;
identifying a second voltage change at the output of the converter elements provided for less significant bits;
comparing the first voltage change to the second voltage change;
identifying a calibration value of the first converter element based on the comparing, wherein the calibration value is subsequently used correct an output of the respective converter element; and
repeating the method for each of the plurality of converter elements provided for the more significant bit.

14. The method of claim 13, wherein the first and second voltage changes are identified from ADC output codes corresponding to each of the voltage changes and the comparing the first voltage change to the second voltage change includes comparing the generated ADC output codes.

15. The method of claim 13, further comprising calibrating the first converter element according to the result of the comparing.

16. The method of claim 13, further comprising storing a result of the comparing as a calibration of the first converter element.

17. The method of claim 13, wherein, in a differential successive approximation register ADC having a pair of complementary signal lines, the converter elements are capacitors, the first and second voltage changes are identified at the output of the converter elements provided for less significant bits in both of the complementary signal lines, and the converter elements provided for less significant bits in both of the complementary signal lines are coupled to the first converter element provided for the more significant bit.

18. The method of claim 13, wherein the second reference potential is a ground potential.

19. The method of claim 13, wherein the converter elements are capacitors and the first converter element has a capacitance equivalent to one of the lower order bit converter elements.

20. The method of claim 13, further comprising iteratively repeating the method substituting for the first converter element a remaining unswitched converter element from a plurality of converter elements provided for a plurality of more significant bits.

21. The method of claim 20, further comprising:
at runtime, after substituting all remaining unswitched converter elements provided for the plurality of more significant bits,
calibrating each of the switched converter elements according to a result of the comparing the first voltage change to the second voltage change for each of the switched converter elements; and
adjusting a ADC output code at the more significant bits according to the calibration.

22. The method of claim 21, further comprising, switching in unison the plurality of converter elements provided for at least one of the more significant bits during a subsequent mode of operation after calibrating each of the switched converter elements.

23. A pipeline analog-digital converter (ADC) comprising:
a backend ADC coupled to a first capacitor and an output of an amplifier;
a plurality of second capacitors coupled to the first capacitor and an input of the amplifier;
a switching arrangement coupled to a plurality of second capacitors and individually switching each of the second capacitors at least once between a plurality of potentials,
wherein the switching arrangement individually switches each of the second capacitors between the potentials to generate a calibration value for each respective second capacitor that is subsequently used to correct an output of the second capacitor.

24. The pipeline ADC of claim 23, wherein, the switching arrangement individually switches each of the second capacitors between a plurality of potentials during a first mode of operation and switches the second capacitors in unison during a second mode of operation.

25. The pipeline ADC of claim 23, wherein the switching arrangement is configured to open circuit those second capacitors that are not being switched.

26. The pipeline ADC of claim 23, wherein each of the second capacitors has a capacitance less than that of the first capacitor.

* * * * *

UNITED STATES PATENT AND TRADEMARK OFFICE
CERTIFICATE OF CORRECTION

PATENT NO. : 8,514,114 B2
APPLICATION NO. : 13/312036
DATED : August 20, 2013
INVENTOR(S) : Ronald A. Kapusta et al.

Page 1 of 1

It is certified that error appears in the above-identified patent and that said Letters Patent is hereby corrected as shown below:

In the Claims:

Column 12, line 5, please change:

"used correct" to --used to correct--

Signed and Sealed this
Twenty-eighth Day of January, 2014

Michelle K. Lee
*Deputy Director of the United States Patent and Trademark Office*